United States Patent
Yamamoto

[19]

[11] Patent Number: 6,049,771
[45] Date of Patent: Apr. 11, 2000

[54] VOICE RECORDING AND REPRODUCING APPARATUS USING MULTIPLE ADPCM COMPRESSION MODES

[75] Inventor: Isao Yamamoto, Kyoto, Japan

[73] Assignee: Rohm Co., Ltd., Kyoto, Japan

[21] Appl. No.: 08/985,395

[22] Filed: Dec. 5, 1997

[30] Foreign Application Priority Data

Mar. 3, 1997 [JP] Japan .................................. 9-063757

[51] Int. Cl.$^7$ ........................................................ G10L 3/02
[52] U.S. Cl. ............................................ 704/501; 704/201
[58] Field of Search .................................... 704/201, 207, 704/208, 500, 501

[56] References Cited

U.S. PATENT DOCUMENTS

| | | | |
|---|---|---|---|
| 4,549,304 | 10/1985 | Weirich et al. | 375/27 |
| 4,726,037 | 2/1988 | Jayant | 375/27 |
| 4,751,736 | 6/1988 | Gupta et al. | 381/31 |
| 5,511,000 | 4/1996 | Kaloi et al. | 364/514 |
| 5,530,750 | 6/1996 | Akagiri | 380/4 |
| 5,570,308 | 10/1996 | Ochi | 364/724.1 |

OTHER PUBLICATIONS

Ramamoorthy "Enhancement of ADPCM speech by adaptive postfiltering" ATT Tech Jour pp. 1465–1475, Oct. 1984.
Cummisket et al "Adaptive quantization in differential PCM coding of speech" ATT Tech Jour pp.1105–1118, Mar. 12, 1973.
CCITT "Recommendation G.726", Dec. 1990.

*Primary Examiner*—Richemond Dorvil
*Assistant Examiner*—Harold Zintel
*Attorney, Agent, or Firm*—Majestic, Parsons, Siebert & Hsue P.C.

[57] ABSTRACT

An apparatus carries out an adaptive pulse code modulation process on voice data and records them in a solid memory which is detachably attached to the apparatus. The code bit number is switched, depending on the selected recording mode. A filter for suppressing a high-voice region of the frequency band of the voice data is used, and there is provided a selector for applying this filter at the time of voice reproduction selectively either always or according to the code bit number.

3 Claims, 7 Drawing Sheets

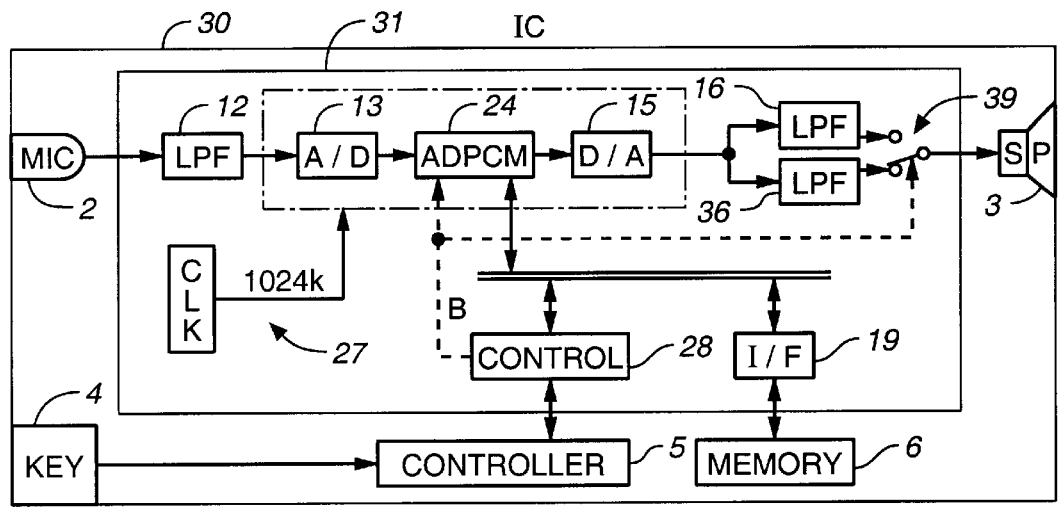
FIG._1A
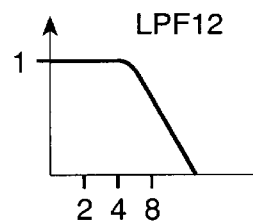
FIG._1B
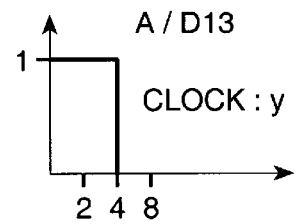
FIG._1C
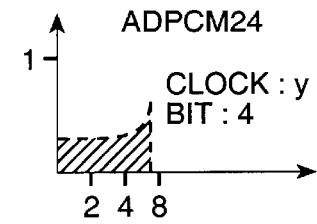
FIG._1D1
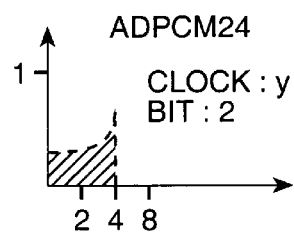
FIG._1D2
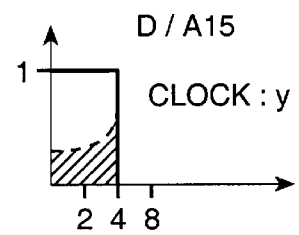
FIG._1E1
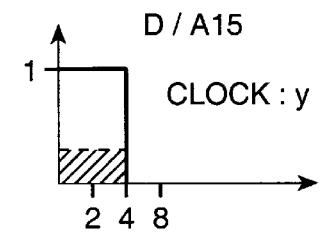
FIG._1E2
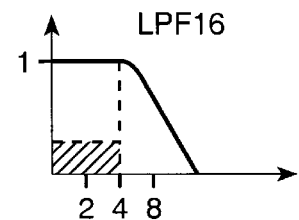
FIG._1F1
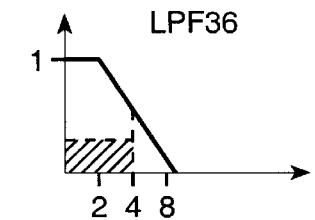
FIG._1F2

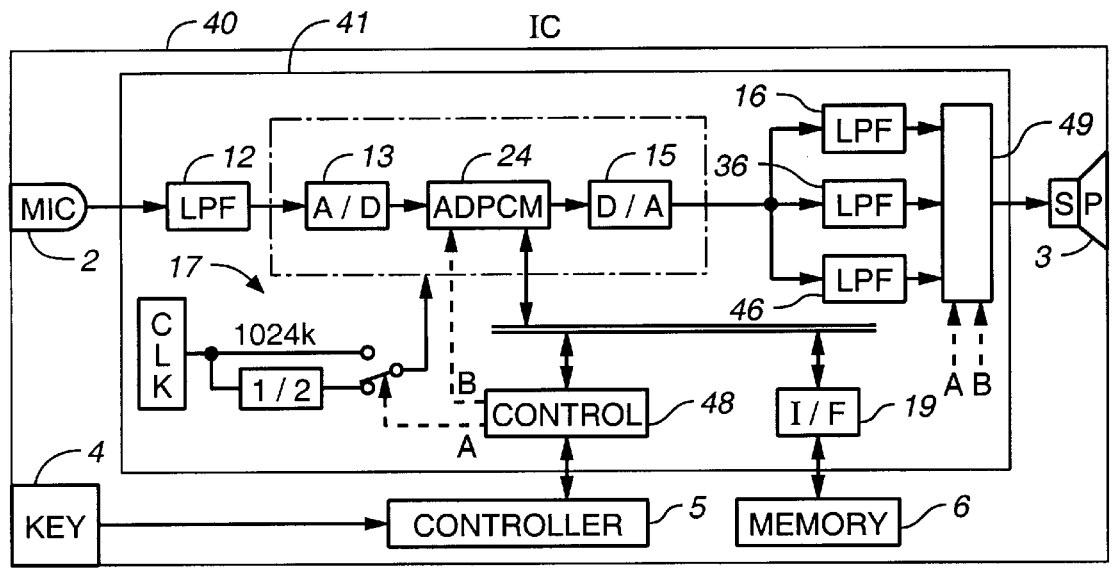
FIG._2A
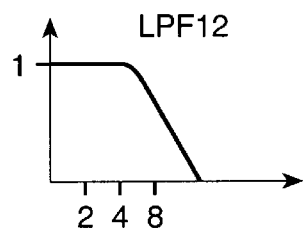
FIG._2B
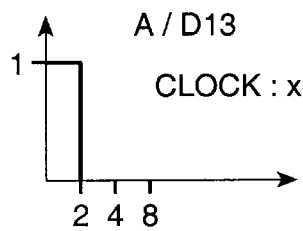
FIG._2C
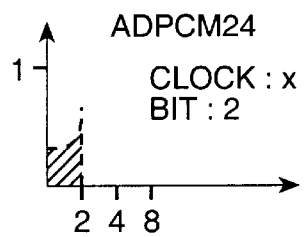
FIG._2D
FIG._2E
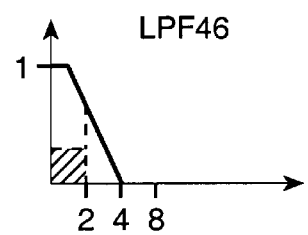
FIG._2F

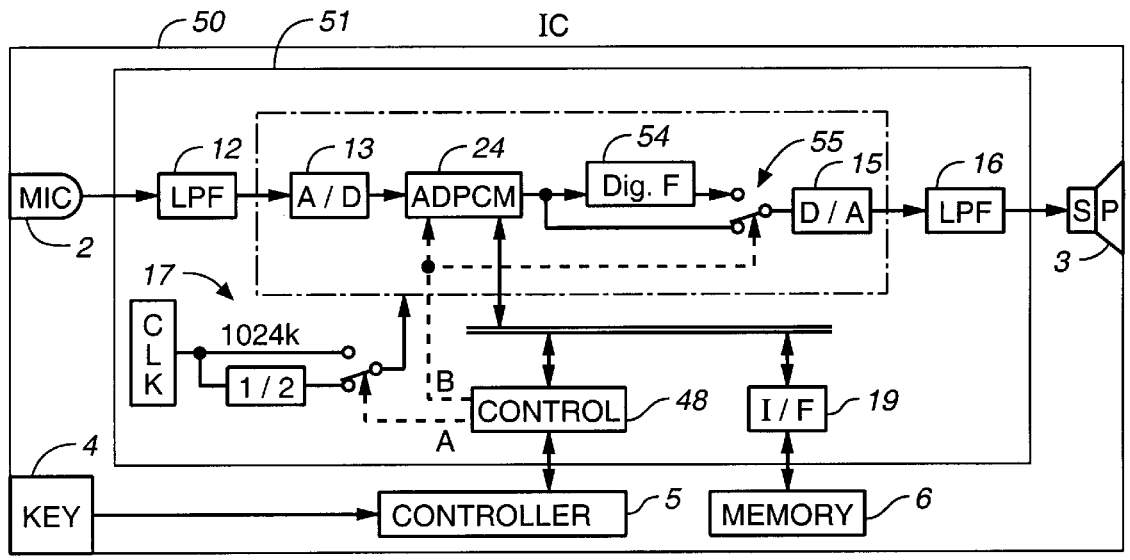
FIG._3A
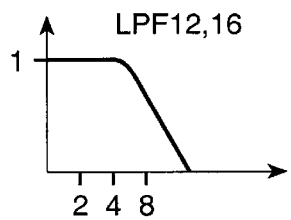
FIG._3B
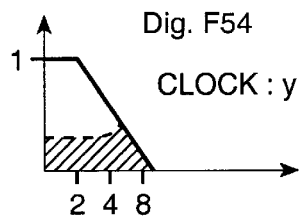
FIG._3C1
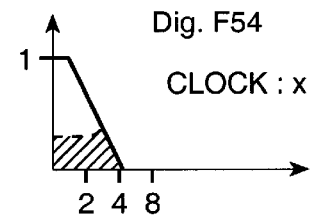
FIG._3C2
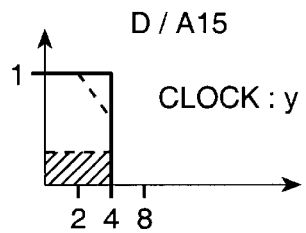
FIG._3D1
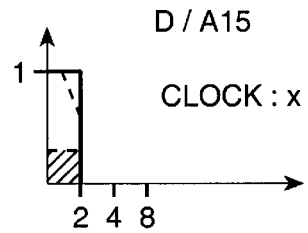
FIG._3D2

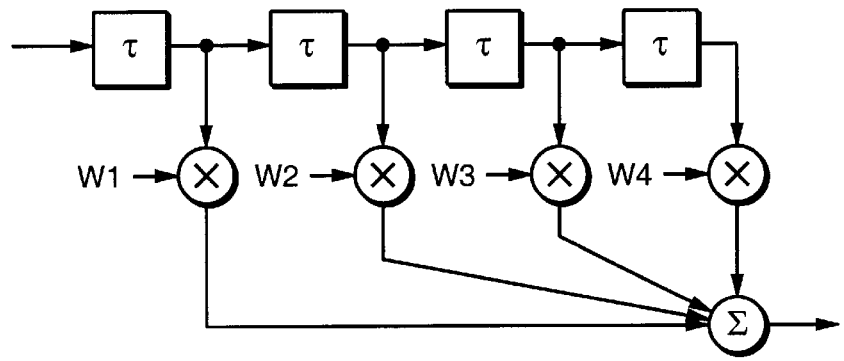
FIG._4A
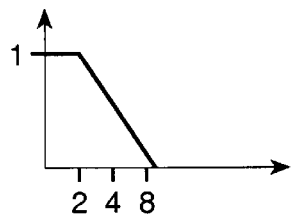
FIG._4B
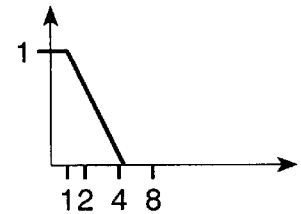
FIG._4C
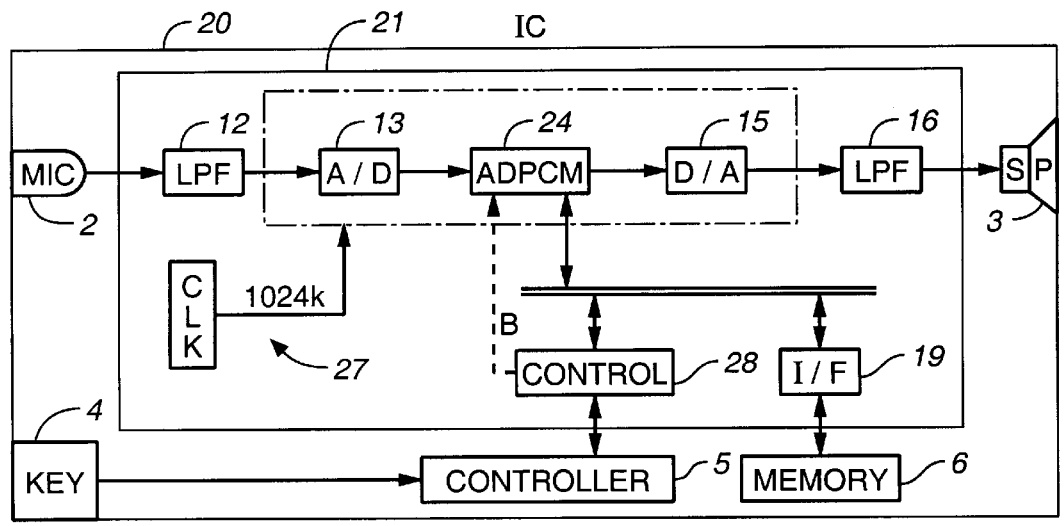
FIG._9
*(PRIOR ART)*

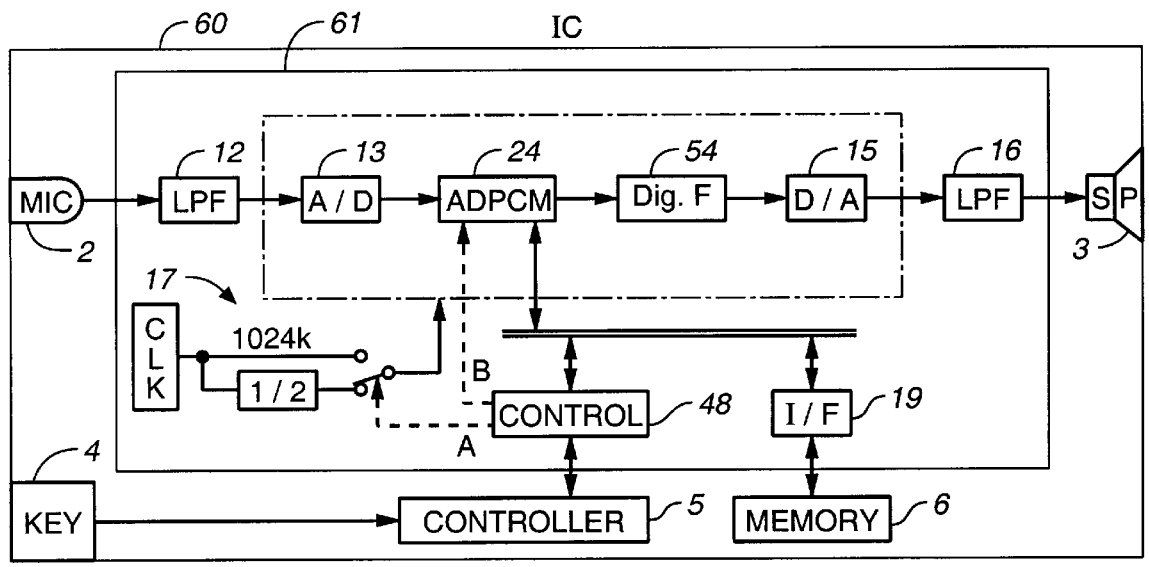
FIG._5A
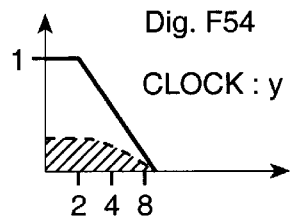
FIG._5B
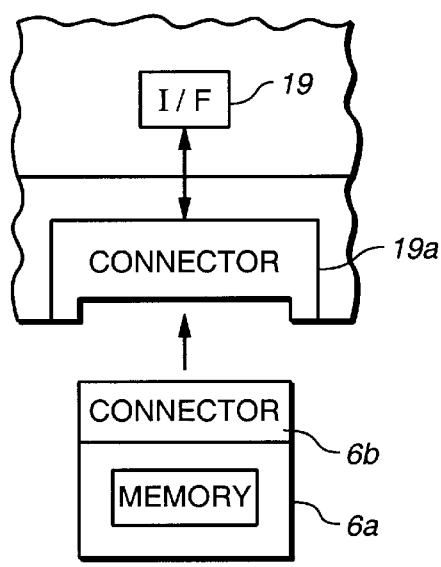
FIG._5C
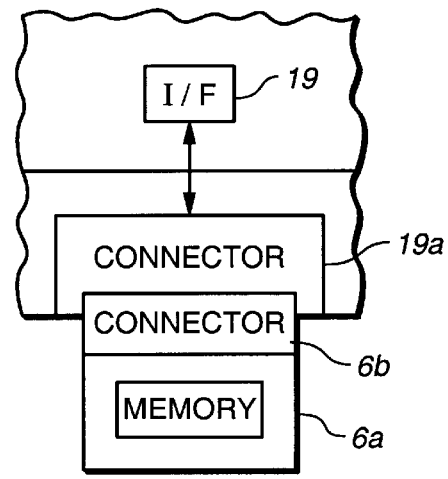
FIG._5D

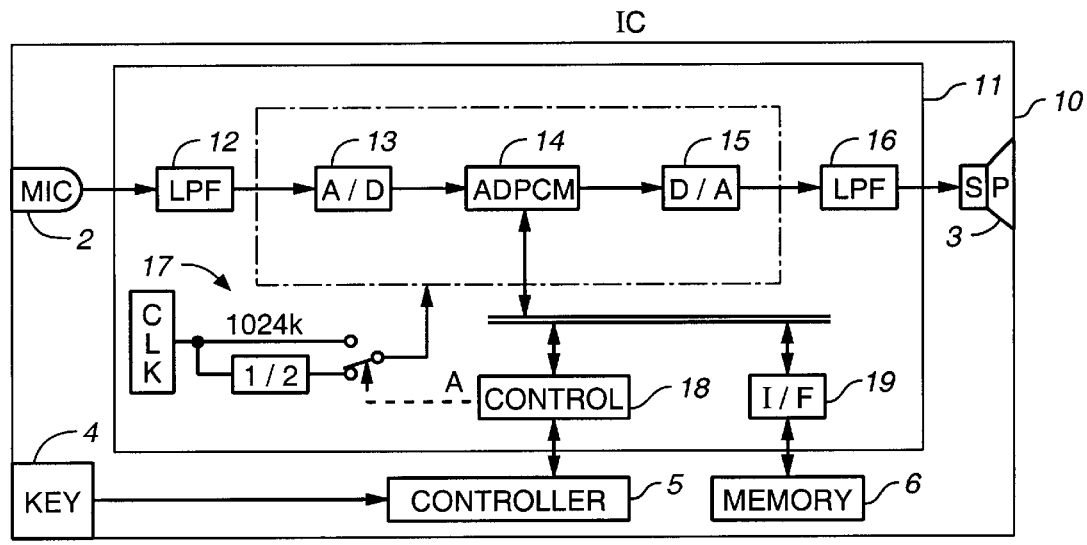
FIG._6A (PRIOR ART)
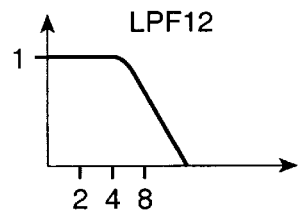
FIG._6B
(PRIOR ART)
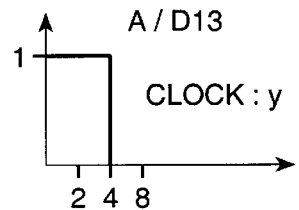
FIG._6C1
(PRIOR ART)
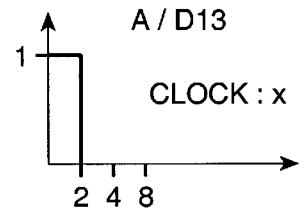
FIG._6C2
(PRIOR ART)
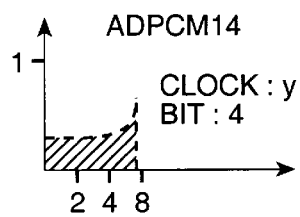
FIG._6D1
(PRIOR ART)
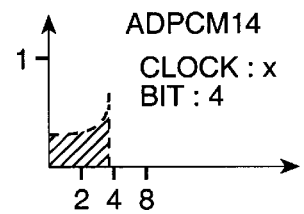
FIG._6D2
(PRIOR ART)
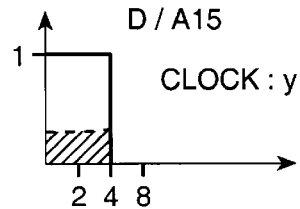
FIG._6E1
(PRIOR ART)
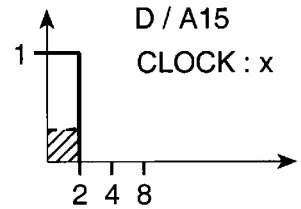
FIG._6E2
(PRIOR ART)
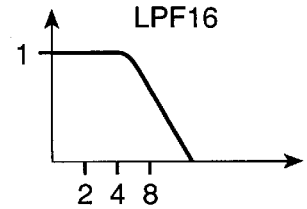
FIG._6F
(PRIOR ART)

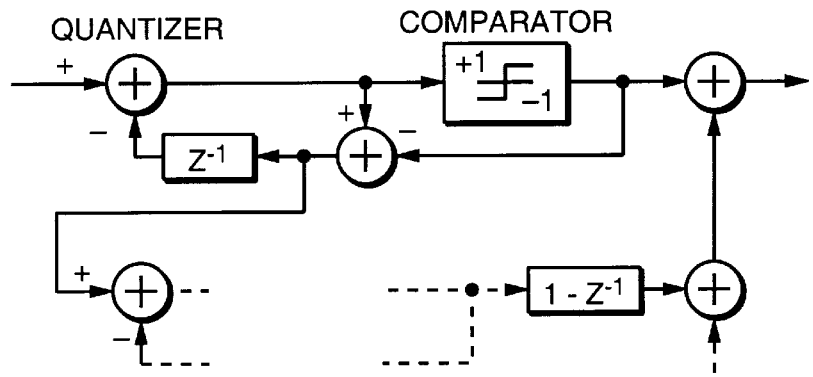
FIG._7A
*(PRIOR ART)*
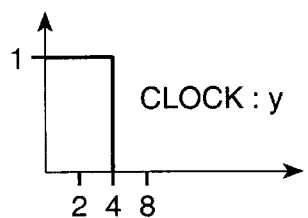
FIG._7B
*(PRIOR ART)*
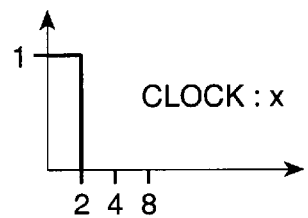
FIG._7C
*(PRIOR ART)*
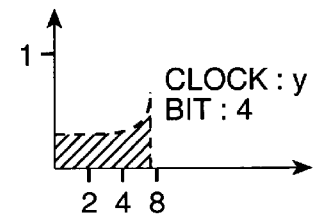
FIG._8C
*(PRIOR ART)*
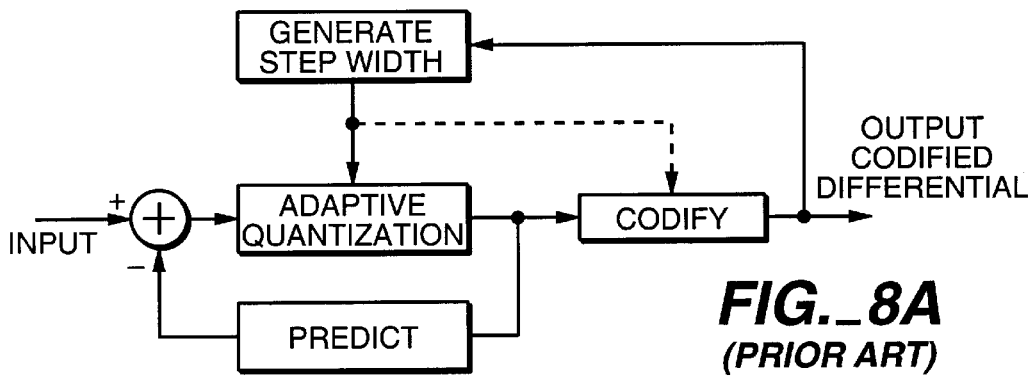
FIG._8A
*(PRIOR ART)*
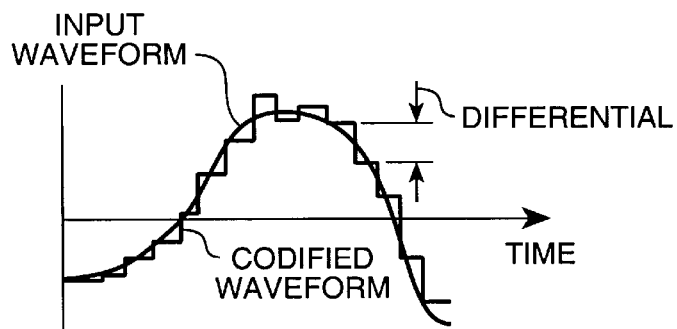
FIG._8B
*(PRIOR ART)*
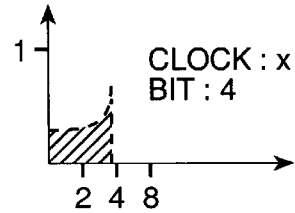
FIG._8D
*(PRIOR ART)*

VOICE RECORDING AND REPRODUCING APPARATUS USING MULTIPLE ADPCM COMPRESSION MODES

BACKGROUND OF THE INVENTION

This invention relates to apparatus for recording sound data onto and/or reproducing such recorded data from a voice recording medium. In particular, this invention relates to such apparatus using a solid memory device such as a semiconductor memory as a recording medium, rather than a tape or a disk, and being adapted to carry out data compression and expansion processes based on adaptive pulse code modulation at the time of recording and reproduction of voice data such that the memory capacity can be improved for the recording of digital voice data. Throughout herein, words "voice" and "sound" are to be interpreted broadly and may be used interchangeably.

Voice recording and/or reproduction apparatus such as tape recorders using a magnetic tape as a memory medium and mini-disks can be improved regarding their durability and miniaturized, inclusive of their electric cells and memory medium, only to a limited extent, and it is because they are mechanically driven. Such limitation can be eliminated if a semiconductor memory is used as memory medium because no mechanical driving will be required, but even with the recent improvements in the semiconductor memory capacity, it is difficult to obtain a memory capacity comparable to that obtainable with a tape. Only such apparatus capable of recording and reproducing voice data from a relatively short conversation or meeting are becoming available.

Prior art voice recording and reproduction apparatus using a solid memory as recording medium make up for their insufficient memory capacity by carrying out a data compression process when digital voice data are recorded onto the solid memory and a data expansion process in reverse when recorded data are reproduced. With some apparatus, it is possible to select whether the data compression ratio is increased in order to increase the recording time with the same memory capacity or decreased because the quality of the sound is more important. FIG. 6A shows a voice recording and reproducing apparatus 10 of this type which uses a known kind of adaptive pulse code modulation routine for data compression. The data compression ratio is varied by adjusting the clock frequency of the adaptive pulse code modulation circuit and other digital signal processing parts such that the sampling frequency fs and the cutoff frequency fc can be made variable.

Explained more in detail, the apparatus 10 shown in FIG. 6A may be in the form of a small box of the size of a cigarette lighter, containing therein a microphone (MIC) 2 serving as a voice input means, a speaker (SP) 3 serving as a voice output means, a keyboard (KEY) 4 through which instructions such as the starting and stopping of recording and reproduction are received, a controller 5 for controlling the overall operations of the apparatus, a memory device 6 which may comprise an electrically erasable non-volatile flash memory having a memory capacity of 4–32 Mb (megabits), and an IC element 11 serving not only to convert analog voice signals inputted from the microphone 2 into digital voice signals and recording them in the memory device 6 under the control of the controller 5 but also to read out digital voice data from the memory device 6, reproduce the voice signals and output them to the speaker 3.

The IC element 11 for voice recording and reproduction includes a low pass filter (LPF) 12 and an A/D conversion circuit (A/D) 13 for receiving an output from the microphone 2 to convert analog voice signals into digital voice data, and there is also provided an adaptive pulse code modulation (ADPCM) circuit 14 for compressing the digital voice data. For reproduction, the same ADPCM circuit 14 is used in reverse for an expansion process, and there are included a D/A conversion circuit 15 for receiving the output from the ADPCM circuit 14 to convert digital voice data into analog voice signals and another low pass filter (LPF) 16. Voice signals outputted from this low pass filter 16 are amplified by an amplifier (not shown) and then transmitted to the speaker 3.

The IC element 11 also contains a clock circuit (CLK) 17 for providing a clock signal to the clock-synchronous digital signal processing part composed of the A/D conversion circuit 13, the ADPCM circuit 14 and the D/A conversion circuit 15. The clock circuit 17 is adapted to output a clock signal of frequency 1024 KHz (referred to as clock signal y) obtained by waveforming a base oscillation signal and a frequency-divided clock signal of frequency 512 KHz (referred to as clock signal x) and also includes a switch circuit for supplying either of the clock signals to the digital signal processing part. There is also provided a control unit (CONTROL) 18 for generating a control signal A and receiving various commands from the controller 5 to generate various individualized control signals for internal circuits of the IC element 11 such as the ADPCM circuit 14. The IC element further includes a memory interface (I/F) 19 for serving not only to generate signals for memory access but also to carry out processes such as changing the number of bits per processing unit and buffering.

The A/D conversion circuit 13, of which a major portion is shown in FIG. 7A, is of the so-called oversampling type commonly used, for example, in an ASIC, serving also as a filter which will pass only the components in the band 0–4 KHz inclusive of the vocal band, as shown in FIG. 7B, the sampling frequency fs becoming 8 KHz when operating by clock signal y. In FIG. 7B (and other similar figures throughout herein), the horizontal axis indicates frequency in units of KHz and the vertical axis indicates the transmissivity of the corresponding frequency component.

When the operation is by clock signal x, since the speed of the operation is one half, the sampling frequency fs becomes 4 KHz and it serves as a filter adapted to pass only the frequency range of 0–2 KHz included in the vocal band range, as shown in FIG. 7C.

Although not explained in detail, the D/A conversion circuit 15 also serves as a filter similarly at the time of digital-to-analog conversion, serving to pass only the components in the frequency range of 0–4 KHz when operating by clock signal y, as shown in FIG. 6E1, and passing only the components in the frequency range of 0–2 KHz when operating by clock signal x, as shown in FIG. 6E2. Since a filtering process with a sharp cutoff characteristic can thus be effected by such A/D and D/A conversion circuits 13 and 15, the low pass filters 12 and 16 which sandwich them in between are required only to remove reflected noise and the noise in clock signals x and y. Thus, simple low pass filters having a gentle cutoff characteristic beyond the vocal frequency range (over 4 KHz), as shown in FIGS. 6B and 6F, are sufficient.

The ADPCM circuit 14 is of a general adaptive pulse code modulation type shown in FIG. 8A, serving to codify the differentials, or the increments, in the waveform of the input signal per unit time, as shown in FIG. 8B. If the number of bits representing the length of the code (hereinafter referred to as the code bit number) is 4, for example, one of code values "0"–"15" is assigned to each value of the differentials "–8", "–7", –"–1", "+1", "+2", –"+8". The quantization noise of this ADPCM circuit 14 increases rapidly, like the D/A conversion circuit 15 although the frequency characteristic changes, depending on whether operating by clock signal x or y, as the frequency approaches from an intermediary value to the sampling frequency fs. As a practical example, the noise increases at frequencies from about 4 KHz to 8 KHz when recording or reproducing by clock signal y (as shown hatched in FIG. 8C) and from about 2 KHz to 4 KHz when recording or reproducing by clock signal x (as shown hatched in FIG. 8D).

When the apparatus 10 thus structured is used for a short-term recording, the keyboard 4 is operated to select a high-fidelity recording mode. The controller 5 responds by causing the control unit 18 to output a corresponding control signal A such that clock signal y with frequency 1024 KHz is supplied from the clock circuit 17 to digital signal processing unit inclusive of the ADPCM circuit 14. Analog voice signal inputted through the microphone 2 is passed through the LPF 12 to have high-frequency components over the vocal frequency band mostly eliminated (as shown in FIG. 6B). It is then converted into digital voice data by means of the A/D conversion circuit 13 and high-frequency components over 4 KHz are simultaneously cut off as shown in FIG. 6C1. The digital voice data are compressed by the ADPCM circuit 14 with the timing of the sampling frequency of 8 KHz by 4-bit encoding and sequentially recorded through the memory interface I/F 19 into the memory device 6. If the capacity of this memory device 6 is 32 Mb, the recording continues for about 16 minutes.

At the time of reproduction, the compressed encoded data are read out from the memory device 6 through the memory interface I/F 19 by the ADPCM circuit 14 operating on the same clock signal y, and the original voice data are reproduced through an expansion process. Although many noise components are contained in the high-frequency region near 8 KHz (as shown hatched in FIG. 6D1), the band components over 4 KHz are cut (as shown in FIG. 6E1) when the data are converted into an analog voice signal by means of the D/A conversion circuit 15 on the downstream side, and the noise components corresponding to the clock signal y caused by the D/A conversion circuit 15 are finally cut (as shown in FIG. 6F) such that a high-quality sound can be outputted from the speaker 3.

When this apparatus 10 is used for a long-term recording, the keyboard 4 is operated to select a long-term recording mode. The control unit 18 outputs a corresponding control signal (also indicated by the same symbol A for convenience), causing clock signal y of frequency 512 KHz to be supplied to the ADPCM circuit 14, etc. After an analog voice signal inputted through the microphone 2 is passed through the LPF 12 to have high-frequency components over the vocal frequency band mostly cut (as shown in FIG. 6B), it is converted into digital voice data by the A/D conversion circuit 13 and high-frequency components over 2 KHz are then cut off (as shown in FIG. 6C2). The digital voice data are compressed by the ADPCM circuit 14 with the timing matching the sampling frequency of 4 KHz by 4-bit encoding and then sequentially recorded in the memory device 6. If the capacity of this memory device 6 is the same (32 Mb), the recording takes about 32 minutes.

At the time of reproduction, the compressed encoded data are read out from the memory device 6 by the ADPCM circuit 14 operating by the same clock signal x, and the original voice data are reproduced through an expansion process. Although many noise components are contained in the high-frequency region below 4 KHz (as shown hatched in FIG. 6D2), the band components over 2 KHz are cut (as shown in FIG. 6E2) when the data are converted into an analog voice signal by means of the D/A conversion circuit 15 on the downstream side, and the noise components corresponding to the clock signal x are cut by the LPF 16 (as shown in FIG. 7C), the reproduced voice being outputted from the speaker 3. Because frequency components over 2 KHz, covering the vocal frequency band, are cut, the sound quality is somewhat affected but a sound reproduction which is good enough for distinguishing voice can be carried out for a time period twice as long as if the high-fidelity recording mode has been selected.

In summary, this apparatus 10 is capable of switching the clock frequency for the adaptive pulse code modulation process to thereby change the sampling frequency fs such that the compression ratio of voice data is altered and a longer recording time becomes possible by sacrificing the sound quality.

Besides the changing of sampling frequency fs, the changing of coding bit number may also be considered as a simple data compression method for extending the time of recording and reproduction with a limited memory capacity. FIG. 9 shows an apparatus 20 of this type with a voice recording and reproducing IC element 21. For convenience, like components of this apparatus 20 and the apparatus 10 shown in FIG. 6A and explained above are indicated by the same numerals and repetitive descriptions may be dispensed with.

The apparatus 20 shown in FIG. 9 has a simpler clock circuit 27 (than the clock circuit 17 of FIG. 6A), adapted to output only clock signal y of frequency 1024 KHz, but its ADPCM circuit 24 has a reduced (to 2 bits) code bit number and is adapted to assign the differentials "–2", "–1", "+1" and "+2" when the long-term recording mode is selected. If the code bit number is thus reduced, the range from which differentials can be taken is also reduced accordingly. As a result, the through-rate of the ADPCM circuit 24 is lowered, and many noise components appear in the high-frequency range below 4 KHz, as shown in FIG. 6D2. Thus, although the apparatus 20 of FIG. 9 functions similarly as the apparatus 10 of FIG. 6A if the high-fidelity mode is selected (as shown in FIGS. 6B, 6C1, 6D1, 6E1 and 6F), if the long-term recording mode is selected, the cutoff frequency of the D/A conversion circuit 15 is constant (over 4 KHz as shown in FIG. 6E1) and hence the corresponding quantization noise components are outputted, too.

In a situation like this, distortions of reproduced voice become large in the high range, making the reproduced voice difficult to understand. This was why prior art voice recording and reproducing apparatus using the adaptive pulse code modulation process did not change the data compression ratio by switching the code bit number but by changing the sampling frequency number fs. According to Japanese Patent Publication Tokkai 7-160300, different encoding and compression methods were used for compressing data by switching the code bit number.

It is not a practical approach, however, to combine an adaptive pulse code modulation circuit and a plurality of data compression methods for switching the code bit number because the scale of the circuit increases in spite of the general requirement for miniaturization. Neither is an increase in the scale of circuit desirable from the point of view of the cost.

The proposal to simply lower the sampling frequency fs is not acceptable because the components between 1–2 KHz, necessary for distinguishing the input voice, are totally lost.

SUMMARY OF THE INVENTION

In summary, it must be avoided to increase the circuit scale and this means that one must rely on a method of data compression and expansion by adaptive pulse code modulation. On the other hand, if the code bit number is reduced in order to increase the recording time, inconveniences of the kind described above are encountered.

It is therefore an object of this invention to provide apparatus and IC elements for voice recording and/or reproduction capable of outputting clearly understandable sound although the code bit number in an adaptive pulse code modulation process is switched.

Broadly speaking, there are two approaches to the problem. According to one approach, a voice recording and reproducing apparatus is provided with a means for switching the code bit number for carrying out an adaptive pulse code modulation process, a filter for blocking the high-frequency region of the frequency band of voice data to be recorded and means for applying this filter to the voice data either always or selectively according to the code bit number of the voice data at the time of reproduction. At the time of recording with such an apparatus, voice data are first subjected to an adaptive pulse code modulation process and then recorded on a solid memory but the code bit number can be switched between a larger number and a smaller number for the process. Since the maximum recording time is inversely proportional to the code bit number if the memory capacity is constant, this means that the user is allowed to select the maximum recording time. Thus, even with a solid memory with a limited capacity, the user can select a small code bit number so as to make the maximum recording time long enough for an ordinary speech or meeting.

At the time of reproduction, a reverse process of adaptive pulse demodulation is carried out on voice data with the filter appropriately blocking a high-voice region of the frequency band. As explained above, if a recording is done with a reduced code bit number, quantization noise caused by distortions in the high region increases rapidly in the reproduced voice. According to this approach of the present invention, the same high-voice region, where abounds the quantization noise, is selectively suppressed. Moreover, both experiences and experiments show that the high-voice region contributes more to the sound quality and that even a small contribution from this region can render the outputted voice understandable. In summary, a reduction in the high-voice region of voice data can effectively control annoying quantization noise while the high-voice components are kept to a certain degree such that the outputted voice data can be made understandable. In other words, understandable voice output can be obtained by the present invention although the code bit number is changed in an adaptive pulse code modulation process.

According to the other of the approaches of the present invention, the filter (referred to above regarding the first approach according to this invention) comprises a digital filter inserted between a demodulation circuit for carrying out a demodulation process corresponding to the aforementioned adaptive pulse code modulation process and a D/A conversion circuit (say, of an oversampling type) on the downstream side, characterized as operating in common by the same clock signal with the demodulation and D/A conversion circuits. Preferably, there should also be included a means for switching the clock signal frequency at the time of the demodulation process.

If the clock frequency is switched by using an apparatus according to the second approach of the present invention, not only the demodulation and D/A conversion circuits but also the filter changes its speed of operation. In the case of a digital filter, a change in the speed of operation affects its frequency characteristics such as the cutoff frequency. At the time of reproduction, the sampling frequency fs in the demodulation and D/A conversion processes are modified and the frequency characteristics of the filter are also changed.

In summary, since the filtering characteristics can be altered by switching the clock frequency, changes in the quantization noise due to the change in the code bit number can be made up for by changing the clock frequency. Thus, in the attempt to further compress data by changing both the sampling frequency and the code bit number, it is possible to reduce the total number of filters because one or a small plural number of filters can be used for both processes. By adapting the approaches of the present invention, the increase in the scale of circuit can be significantly inhibited in designing a voice recording and reproducing apparatus capable of outputting understandable voice signals although the code bit number is switched down in an adaptive pulse code modulation process.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1A is a block diagram of a voice recording and reproducing apparatus according to a first embodiment of this invention and FIGS. 1B, 1C, 1D1, 1D2, 1E1, 1E2, 1F1 and 1F2 are frequency characteristics of components shown in FIG. 1A;

FIG. 2A is a block diagram of a voice recording and reproducing apparatus according to a second embodiment of this invention and FIGS. 2B, 2C, 2D, 2E and 2F are frequency characteristics of components shown in FIG. 2A;

FIG. 3A is a block diagram of a voice recording and reproducing apparatus according to a third embodiment of this invention and FIGS. 3B, 3C1, 3C2, 3D1 and 3D2 are frequency characteristics of some of the components shown in FIG. 3A;

FIG. 4A is a block diagram of the digital filter shown in FIG. 3A and

FIGS. 4B and 4C are frequency characteristics of the digital filter of FIG. 3A;

FIG. 5A is a block diagram of a voice recording and reproducing apparatus according to a fourth embodiment of this invention, FIG. 5B is a frequency characteristic of its digital filter, and FIGS. 5C and 5D are schematic drawings of a portion of any of the apparatus shown in FIGS. 1A, 2A, 3A and 5A with a detachably attachable memory device;

FIG. 6A is a block diagram of a prior art voice recording and reproducing apparatus and FIGS. 6B, 6C1, 6C2, 6D1, 6D2, 6E1, 6E2 and 6F are frequency characteristics of components shown in FIG. 6A;

FIG. 7A is a block diagram of an A/D conversion device of the oversampling type and FIGS. 7B and 7C are its frequency characteristics;

FIG. 8A is block diagram of an adaptive pulse code modulation means,

FIG. 8B is a waveform of a signal to be codified, and

FIGS. 8C and 8D are its frequency characteristics; and

FIG. 9 is a block diagram of another prior art voice recording and reproducing apparatus.

In each of the graphs in FIGS. 1B, 1C, 1D1, 1D2, 1E1, 1E2, 1F2, 2B, 2C, 2D, 2E, 2F, 3B, 3C1, 3C2, 3D1, 3D2, 4B, 4C, 5B, 6B, 6C1, 6C2, 6D1, 6D2, 6E1, 6E2, 6F, 7B, 7C, 8C and 8D, the horizontal axis indicates the frequency of a signal or a clock in logarithmic scale and the vertical axis indicates the through rate of the ratio between the output signal level and the input signal level, for each frequency in the case of solid line and the ratio between the noise level and the total signal level, or the noise ratio, in the case of a graph with hatching.

Throughout herein, like components are indicated by the same numeral although they may be components of different apparatus according to different embodiments and repetitive description may be omitted for convenience of disclosure. In all frequency characteristic graphs, the vertical axis represents transmissivity and the horizontal axis represents frequency.

DETAILED DESCRIPTION OF THE INVENTION

The invention is described next in turn as manifested in the form of a voice recording apparatus, a voice reproducing apparatus and an IC element for voice recording and reproduction.

Firstly, a voice recording apparatus according to this invention may be characterized as that portion of the apparatus adopting the approaches of the present invention which carries out the process of voice reproduction, to which a solid memory is detachably attached. Such an apparatus may be characterized as serving to record voice data in a solid memory after carrying out an adaptive pulse code modulation process and comprising a means for switching the code bit number (between two values) when carrying out the adaptive pulse code modulation process and means for detaching and attaching the solid memory. By attaching such a solid memory for recording, an apparatus described in the summary section above can carry out a recording process.

Secondly, a voice reproducing apparatus according to this invention may be characterized as that portion of the apparatus adopting the approaches of the present invention which carries out the process for voice reproduction, to which a solid memory is detachably attached. Such an apparatus may be characterized as serving to reproduce voice signal by reading from the solid memory voice data which have been subjected to adaptive pulse code modulation, and comprising a filter for suppressing a high-voice region of the frequency band of the voice data, means for applying this filter to the voice data either always or selectively according to the code bit number of the voice data and means for attaching and detaching the solid memory. By attaching such a solid memory having voice data recorded therein, an apparatus described in the summary section above can carry out a voice reproduction process. It now goes without saying that an apparatus for voice recording and reproducing can be obtained by combining an apparatus for voice recording and an apparatus for voice reproduction.

Thirdly, an IC element according to this invention may be characterized as being obtained by separating and integrating the portions of the apparatus adopting the approaches of the present invention which carry out the processes of voice recording and reproduction. Such an IC element may be characterized as comprising an interface for connection to a solid memory, means for carrying out an adaptive pulse code modulation process on voice data outputted through the interface for recordation (before they are outputted) and means for reading out voice data recorded through the interface and carrying out voice reproduction process, these means comprising elements as explained above. By inserting such an IC element, it becomes possible to provide compact and inexpensive voice recording and reproducing apparatus.

The invention is further described below by way of four (first though fourth) practical embodiments. The first and second embodiments are characterized as using analog filters according to the aforementioned first approach, while the third and fourth embodiments are characterized as using digital filters according to both the aforementioned first and second approaches. The first embodiment is further characterized as changing only the code bit number but not the sampling frequency fs while the second through fourth embodiments are adapted to carry out changes of both the code bit number and the sampling frequency fs.

First Embodiment

FIG. 1A shows a voice recording and reproducing apparatus 30 with a voice recording and reproducing IC element 31 according to the first embodiment of the invention, structured similarly to the apparatus 20 shown in FIG. 9, having an ADPCM circuit 24 and a control unit 28 as described above to switch between a larger and a smaller code bit number when carrying out an adaptive pulse code modulation process. The apparatus 30 according to the first embodiment is different and characterized wherein there are two LPFs 16 and 36 arranged parallel to each other and there is also provided a selector 39 adapted to receive outputs from these two LPFs 16 and 36 and to output one of them to the speaker 3 according to a control signal B received from the control unit 28. The additional LPF 36 is an analog filter with its frequency characteristics shown in FIG. 1F2, beginning to drop at about 2 KHz and completely dropping at about 8 KHz. Thus, the apparatus 30 serves to suppress high-voice components in the frequency band of voice data when the LPF 36 is selected.

When this apparatus 30 is used for a short-term recording, the keyboard 4 is operated to select the high-fidelity recording mode. The controller 5 causes the control unit 28 to output control signal B and the code bit number for the ADPCM circuit 24 operated by clock signal y is set to be 4 bits. The selector 39 is set such that the output from the LPF 16 is outputted through the speaker 3. Analog voice signal received by the microphone 2 is passed through the LPF 12 to have its high-frequency components over the vocal band mostly cut (as shown in FIG. 1B) and converted into a digital voice signal by the A/D conversion circuit 13. At the same time, its high-frequency components over 4 KHz are cut (as shown in FIG. 1C) and the digital voice data are compressed by 4-bit encoding at the same timing of 8 KHz as the sampling frequency by means of the ADPCM circuit 24 and thereafter sequentially recorded in the memory device 6 through the memory interface I/F 19. If the capacity of this memory device 6 is 32 Mb, the recording continues for about 16 minutes.

At the time of reproduction, the compressed encoded data are read out from the memory device 6 through the memory interface I/F 19 by means of the ADPCM circuit 24 operating by the same clock signal y and the original voice data are reproduced through an expansion process. Although many noise components are contained in the high-frequency region near 8 KHz (as shown hatched in FIG. 1D1), the band components over 4 KHz are cut (as shown in FIG. 1E1)

when the data are converted into an analog voice signal by the D/A conversion circuit 15 on the downstream side, and the noise components corresponding to the clock signal y caused by the D/A conversion circuit 15 are finally cut by the LPF 16 (as shown in FIG. 1F1) such that a high-quality sound can be outputted from the speaker 3.

When this apparatus 30 is used for a long-term recording, the keyboard 4 is operated to select a long-term recording mode. The control unit 18 again outputs a corresponding control signal B, setting the code bit number of the ADPCM circuit 24 operating by the same clock signal y to be 2 bits. The selector 39 is set so as to output the voice signal through the LPF 36 to the speaker 3. After an analog voice signal inputted through the microphone 2 is passed through the LPF 12 to have high-frequency components over the vocal frequency band mostly cut (as shown in FIG. 1B), it is converted into digital voice data by the A/D conversion circuit 13 and high-frequency components over 4 KHz are cut off at the same time (as shown in FIG. 1C). Up to this point, the operations are identical to those when the high-fidelity recording mode has been selected but the digital voice data are compressed by the ADPCM circuit 24 at the timing matching the sampling frequency of 8 KHz by 2-bit encoding and then sequentially recorded in the memory device 6 through the memory interface I/F 19. If the memory capacity is the same (32 Mb), the recording takes about 32 minutes.

At the time of reproduction, the compressed encoded data are read out from the memory device 6 by the ADPCM circuit 24 operating by the same clock signal y, and the original voice data are reproduced through an expansion process. Although many noise components are contained in this case in the high-frequency region below 4 KHz (as shown hatched in FIG. 1D2) and they pass through the D/A conversion circuit 15 on the downstream side, the noise components corresponding to the clock signal y are cut and sensory corrections are also made in the components in the frequency band over 2 KHz at the same time (as shown in FIG. 1F2) when they are converted into an analog voice signal (as shown in FIG. 1E2), since the LPF 36 is selected in this situation (rather than the LPF 16 as in FIG. 6A).

In summary, a selection is made at the time of reproduction between the two LPFs with different filtering characteristics, depending on the code bit number of the voice data. As a result, a voice signal which is understandable when it is listened to, although the sound quantity is somewhat inferior, can be reproduced over a period of time twice as long as if the high-fidelity recording mode is selected.

Second Embodiment

FIG. 2A shows another voice recording and reproducing apparatus 40 with a voice recording and reproducing IC element 41 according to the second embodiment of the invention structured similarly to the apparatus 30 shown in FIG. 1A, having an ADPCM circuit 24 and other components as described above to switch between a larger and smaller bit code number when carrying out an adaptive pulse code demodulation process. The apparatus 40 of FIG. 2A is different from the apparatus 30 of FIG. 1A in that the clock circuit 27 of FIG. 1A is replaced by the clock circuit 17 as explained above with reference to FIG. 6A and that the control unit 28 of FIG. 1A is replaced by a different control unit 48 which is adapted to possess the functions of both control units 18 and 28 described above with reference respectively to FIGS. 6A and 9, and to output both control signals A and B. Thus, this apparatus 40 according to the second embodiment of this invention is adapted to change the sampling frequency fs at the time of its adaptive pulse code modulation processing by changing the clock frequency.

In addition to the two LPFs 16 and 36, there is still another LPF 46 connected in parallel, and the selector 39 of FIG. 1A is replaced by another selector 46 adapted to receive outputs of these three LPFs 16, 36 and 46 and to select one of them and to output the selected one to the speaker 3 in response to the control signal A or B received from the control unit 48. The additional LPF 46 is also an analog filter, having a filtering characteristic as shown in FIG. 2F, beginning to drop at about 1 KHz over the vocal frequency range and dropping completely at about 4 KHz. Thus, the apparatus 40 serves not only to suppress a high-frequency region in the frequency band of voice data when the LPF 36 is selected but also to even more strongly suppress the high-frequency region in the frequency band of voice data when the LPF 46 is selected.

This apparatus 40 operates similarly to the apparatus 30 explained above when used for a short-term and long-term recording, the frequency characteristics of transmissivity of the A/D conversion circuit 13, the ADPCM circuit 24, the D/A conversion circuit 15 and the LPFs 16 and 36 being as shown respectively in FIGS. 1C, 1D1 or 1D2, 1E1 or 1E2 and 1F1 or 1F2. Thus, only its operations for a very long-term recording will be explained next.

When the very long-term recording mode is selected through the keyboard 4, the control unit 48 outputs a control signal A to cause clock signal x of 512 KHz to the ADPCM circuit 24, etc. The control unit 48 also outputs a control signal B in this mode of operation to set the code bit number by the ADPCM circuit 24 to be 2 bits. The selector 49 is set to output the signal through the LPF 46 to the speaker 3. Analog voice signal received by the microphone 2 is passed through the LPF 12 to have its high-frequency components over the vocal band mostly cut (as shown in FIG. 2B) and converted into a digital voice signal by the A/D conversion circuit 13. At the same time, its high-frequency components over 2 KHz are cut (as shown in FIG. 2C). Thereafter, the digital voice data are compressed by 2-bit encoding at the timing matching the sampling frequency of 4 KHz by means of the ADPCM circuit 24 and sequentially recorded in the memory device 6 through the memory interface I/F 19. If the memory capacity is the same (32 Mb), the recording can continue for about 64 minutes.

At the time of reproduction, the compressed encoded data are read out from the memory device 6 by means of the ADPCM circuit 24 operating by the same clock signal x and the original voice data are reproduced through an expansion process. Although many noise components are contained in the high-frequency region below 2 KHz (as shown hatched in FIG. 2D) and they pass through the D/A conversion circuit 15 on the downstream side when they are converted into an analog voice signal (as shown in FIG. 2E), since the third LPF 46 is selected in this situation, the noise components corresponding to the clock signal x are cut and sensory corrections are also made in the components in the frequency band over 1 KHz at the same time (as shown in FIG. 2F).

In summary, the additional LPF 46 can be selected at the time of reproduction, depending on the code bit number of the voice data and the sampling frequency fs such that a sufficiently understandable voice signal, although the sound quality is somewhat inferior, can be reproduced over an extended period of time four times as long as if the high-fidelity recording mode is selected.

Third Embodiment

FIG. 3A shows still another voice recording and reproducing apparatus 50 with a voice recording and reproducing IC element 51 according to the third embodiment of the invention structured similarly to the apparatus 40 shown in FIG. 2A but different therefrom in that a digital filter (Dig. F) 54 and a selector 55 are provided between the ADPCM circuit 24 and the D/A conversion circuit 15 instead of the LPF 36 and 46 and the selector 49 of FIG. 2A.

The digital filter 54 is of an ordinary FIR type as shown in FIG. 4A, weighed by weight coefficients W1–W4 for each time delay so as to provide a filtering characteristic as will be explained below. It is formed, like the A/D conversion circuit 13, the ADPCM circuit 24 and the D/A conversion circuit 15, as a clock-synchronous circuit, adapted to receive the same clock signal, that is, to operate by the clock signal x or y supplied from the clock circuit 17. When it operates by the clock signal y, its filtering characteristic is like that of LPF 36 (shown in FIG. 1F2), that is, its frequency characteristic graph begins to drop at about 2 KHz within the vocal range and completely drops somewhere above 8 KHZ as shown in FIG. 4B. When it operates by the clock signal x, its filtering characteristic is like that of LPF 46 (shown in FIG. 2F), that is, its frequency characteristic begins to drop at about 1 KHz within the vocal range and completely drops somewhere above 4 KHz at shown in FIG. 4C. In summary, not only is the digital filter 54 easy to incorporate into a digital IC element but its filtering characteristics also can be changed by switching the clock frequency.

The selector 55 is adapted to receive the output from the ADPCM circuit 24 and that from the digital filter 54 and to transmit either of them to the D/A conversion circuit 15 according to the control signal B received from the control unit 48.

When used in the short-term recording mode, this apparatus 50 operates similarly as explained above with reference to FIGS. 3B, 1C, 1D1 and 1E2, and hence its explanation will be omitted. When it is used in the long-term recording mode, too, the apparatus 50 also operates similarly as explained above with reference to FIGS. 3B and 1C. The operations are somewhat different, however, when it is in the long-term reproduction mode. In this mode, the code bit number by the ADPCM circuit 24 is set to be 2 bits according to the control signal B and the selector 55 is set to select the digital filter 54. The compressed encoded data are read out from the memory device 6 by means of the ADPCM circuit 24 operating by the clock signal y, and after the original voice data are reproduced through an expansion process, the noise components (shown hatched in FIG. 1D2) in the high-frequency region over 2 KHz are immediately suppressed by the digital filter 54 (as shown in FIG. 3C1) and an analog voice signal is obtained (as shown in FIG. 3D1). Sensory corrections are thus carried out by a digital signal processing against the band components over 2 KHz.

When the apparatus 50 is used for recording for a very long period, the operations are the same as explained above with reference to FIGS. 3B and 2C but the operations are different for reproduction. In this case, in addition to the setting of the code bit number to 2 and the selection of the digital filter 54, the clock signal x of 512 KHz is supplied to the ADPCM circuit 24, etc. according to the control signal A from the control unit 48. The compressed encoded data are read out from the memory unit 6 by means of the ADPCM circuit 24 and original voice data are obtained through an expansion process. This time, many noise components are contained (as shown hatched in FIG. 2D) also in the high-frequency range below 2 KHz but the noise components in the range over 1 KHz are suppressed (as shown in FIG. 3C2) by means of the digital filter 54 after the expansion process has been carried out before the conversion is made into an analog voice signal (as shown in FIG. 3D2). Thus, sensory corrections are also carried out by a digital signal processing against the band components over 1 KHz.

In summary, the digital filter 54 is selectively applied at the time of reproduction, depending on the code bit number of the voice data and the sampling frequency fs, and not only the sampling frequency fs but also the characteristics of the digital filter 54 are changed by a simple switching of the clock frequency. As a result, a sufficiently understandable voice signal, although the sound quality is somewhat inferior, can be reproduced over an extended period of time four times as long as if the high-fidelity recording mode is selected.

Fourth Embodiment

FIG. 5A shows still another voice recording and reproducing apparatus 60 with a voice recording and reproducing IC element 61 according to the fourth embodiment of the invention structured similarly to the apparatus 50 shown in FIG. 3A but different therefrom in that the selector 55 of the apparatus 50 is eliminated and that the output from the ADPCM circuit 24 is always transmitted to the D/A conversion circuit 15 through the digital filter 54. Since the digital filter 54 functions even in the case of a short-term recording, the voice data are always subjected to the filter 54 at the time of reproduction (as shown in FIG. 5B). In other words, sensory corrections are carried out in a high-voice region not only for a very long term or long-term recording but also for a short-term recording, but it does not give rise to any difficulty in hearing a voice signal. Thus, the scale of the voice recording and reproducing ID 61, etc. can be reduced by the omission of the selector 55.

In the above, the invention was described by assigning only a limited number of special values to the cutoff frequency, the sampling frequency and the clock frequency (such as 2, 4, 8, 512 and 1024 KHz) but these values are not intended to limit the scope of the invention. In practical applications, these values may be appropriately modified if their qualitative relationships are properly maintained.

Although the embodiments of the present invention were all described above, for convenience, as incorporating a memory device (indicated by numeral 6), memory devices which are detachably attachable to different recording and reproducing apparatus are preferred. FIGS. 5C and 5D show such a detachably attachable memory device 6a which may be in the form of a portable unit such as a cassette or an IC card having a connector 6b. On the part of the recording and/or reproducing apparatus (such as shown at 30, 40, 50 or 60 respectively in FIGS. 1, 2, 3 and 5), the memory interface I/F 19 is connected to a memory-connecting terminal 19a and a structure such as a cassette holder for receiving and detachably attaching the connector 6b of the portable memory device 6a. FIG. 5D shows when the detachable memory device 6a is attached to the terminal 19a on the part of the apparatus and FIG. 5C shows when the detachable memory device 6a has been pulled apart from the apparatus, for example, by being pulled out of a cassette holder-like structure provided on the apparatus (such as 30, 40, 50 and 60).

In summary, all such modifications and variations of the described embodiments that may be apparent to a person skilled in the art are intended to be included within the scope of this invention.

What is claimed is:

1. A voice recording and reproducing apparatus for carrying out an adaptive pulse code modulation process on voice data which are within a voice frequency range, thereafter a recording process for recording said processed data in a solid memory, and also a reproduction process for reproducing voice signal from recorded voice data, said apparatus comprising:

- switching means for switching code bit number in said adaptive pulse code modulation process;
- a digital filter for suppressing a high voice region within said voice frequency range of said voice data;
- filter application means for applying said filter to said voice data selectably either always or according to said code bit number when said reproduction process is carried out;
- a demodulation circuit which carries out a demodulation process when said reproduction process is carried out; and
- a D/A conversion circuit on downstream side of said demodulation circuit, wherein said digital filter, said demodulation circuit and said D/A conversion circuit operate on a same clock signal.

2. A voice reproducing apparatus for carrying out a reproduction process by reading out from a solid memory voice data which are within a voice frequency range and have been obtained by an adaptive pulse code modulation process and reproducing voice signal therefrom, said apparatus comprising:

- a digital filter for suppressing a high voice region within said voice frequency range of said voice data;
- filter application means for applying said filter to said voice data selectably either always or according to code bit number of said voice data when said reproduction process is carried out;
- a demodulation circuit which carries out a demodulation process when said reproduction process is carried out;
- a D/A conversion circuit on downstream side of said demodulation circuit, wherein said digital filter, said demodulation circuit and said D/A conversion circuit operate on a same clock signal; and
- means for attaching said solid memory to said apparatus and detaching said solid memory from said apparatus.

3. A voice recording and reproducing IC element comprising:

- an interface for a solid memory;
- means for carrying out an adaptive pulse code modulation process on voice data outputted through said interface for recordation;
- means for reading out recorded voice data through said interface and carrying out a voice reproduction process thereon;
- switching means for switching code bit number in said adaptive pulse code modulation process;
- a digtal filter for suppressing a high voice region within voice frequency range of said voice data;
- filter application means for applying said filter to said voice data selectably either always or according to said code bit number when said reproduction process is carried out;
- a demodulation circuit which carries out a demodulation process when said voice reproduction process is carried out; and
- a D/A conversion circuit on downstream side of said demodulation circuit, wherein said demodulation circuit and said D/A conversion circuit operate on a same clock signal.

* * * * *